United States Patent
Allpress

[19]

[11] Patent Number: 5,926,455
[45] Date of Patent: Jul. 20, 1999

[54] RECURSIVE FILTERS FOR POLYPHASE STRUCTURES

[75] Inventor: Stephen A. Allpress, Hoboken, N.J.

[73] Assignee: Lucent Technologies Inc., Murray Hill, N.J.

[21] Appl. No.: 08/769,980

[22] Filed: Dec. 19, 1996

[51] Int. Cl.[6] .................................................. H04J 3/00
[52] U.S. Cl. ................... 370/210; 375/350; 364/724.01; 364/724.17; 364/726
[58] Field of Search ....................... 370/210; 364/724.01, 364/724.17, 726; 375/350

[56] References Cited

U.S. PATENT DOCUMENTS

| | | | |
|---|---|---|---|
| 4,107,470 | 8/1978 | Maruta | 179/15 FS |
| 4,785,447 | 11/1988 | Ichiyoshi | 370/70 |
| 5,757,867 | 5/1998 | Caulfield et al. | 375/350 |

*Primary Examiner*—Jason Chan
*Assistant Examiner*—Jasper Kwoh

[57] ABSTRACT

Polyphase channelizing transmitters convert multiple signal channels into a single stream for transmission and corresponding polyphase channelizing receivers process the received stream to recover signals corresponding to the original signal channels. The filter transfer functions for both the transmitters and receivers are designed to have non-recursive numerators and recursive denominators. Such filters can be realized using non-recursive (e.g., finite impulse response (FIR)) filters and recursive (e.g., infinite impulse response) filters on opposite sides of a Fourier transform. For a given application, polyphase structures of the present invention may require fewer coefficients to implement than conventional (e.g., FIR-based) solutions and will therefore be less complex and less expensive.

12 Claims, 10 Drawing Sheets

RECURSIVE FILTERS FOR POLYPHASE STRUCTURES

BACKGROUND OF THE INVENTION

1. Field of the Invention

The present invention relates to communications systems, and, in particular, to receivers and transmitters having polyphase structure.

2. Description of the Related Art

In many communications schemes, multiple signal channels are processed within a transmitter for transmission as a single signal stream to a receiver which is then able to process the received signal stream to recover the individual signal channels. Examples of such communications schemes are analog AMPS (American Mobile Phone System) and the time division multiple access (TDMA) industry standard (IS)-54 scheme. In order to reduce overall equipment cost, such channelizing transmitters and receivers are often designed to use as much common equipment as possible for processing all of the signal channels. One advantage of these so-called "block processing" techniques is that there will typically not be significant additional costs incurred as extra signal channels are added to the system.

Referring now to FIG. 1, there is shown a representation of an example of the filter specification requirements for AMPS and TDMA (IS-54). According to those specification, all candidate transfer functions should lie outside regions identified as 102 and 104 in FIG. 1. One aspect of the present invention is to provide channelizing transmitters and receivers that satisfy the requirements for communications schemes such as AMPS and TDMA (IS-54). Structures in accordance with the present invention may be implemented with fewer coefficients—and are therefore less complex and less expensive—than conventional designs.

Further aspects and advantages of this invention will become apparent from the detailed description which follows.

SUMMARY OF THE INVENTION

In one embodiment, the present invention is a polyphase receiver, comprising (a) a serial-to-parallel converter adapted to convert a serial stream of signals corresponding to M signal channels into M parallel streams; (b) M FIR filters, each of which is adapted to filter one of the M parallel streams; (c) a Fourier transform adapted to transform the M FIR-filtered streams to generate M transformed streams; and (d) one or more recursive filters, each of which is adapted to filter one of the transformed streams to recover one of the M signal channels.

In another embodiment, the present invention is a method for processing communications signals, comprising the steps of (a) receiving a serial stream of signals corresponding to M signal channels; (b) converting the serial stream into M parallel streams; and (c) applying a filter to the M parallel streams to recover the M signal channels, wherein the filter implements a function comprising a non-recursive numerator and a recursive denominator that is a polynomial in $z^M$.

In yet another embodiment, the present invention is a polyphase transmitter, comprising (a) L recursive filters, each of which is adapted to recursively filter one of M parallel streams corresponding to M signal channels, wherein L is between one and M inclusive; (b) a Fourier transform adapted to transform the L recursively filtered streams and the (M-L) other parallel streams to generate M transformed streams; (c) M FIR filters, each of which is adapted to filter one of the M transformed streams; and (d) a parallel-to-serial converter adapted to convert the M FIR-filtered streams into a serial stream of signals corresponding to the M signal channels for transmission.

In still another embodiment, the present invention is a method for processing communications signals, comprising the steps of (a) receiving M parallel streams corresponding to M signal channels; (b) applying a filter to the M parallel streams to generate M parallel filtered streams, wherein the filter implements a function comprising a non-recursive numerator and a recursive denominator that is a polynomial in $z^M$; and (c) converting the M parallel filtered streams into a serial stream of signals corresponding to the M signal channels for transmission.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

According to some embodiments, the present invention is directed to channelizing transmitters and receivers that implement recursive polyphase filters. The inventor has found that such structures can be implemented using fewer coefficients than conventional designs. As a result, channelizing transmitters and receivers in accordance with the present invention can be simpler and less expensive than conventional systems.

Figure 2:
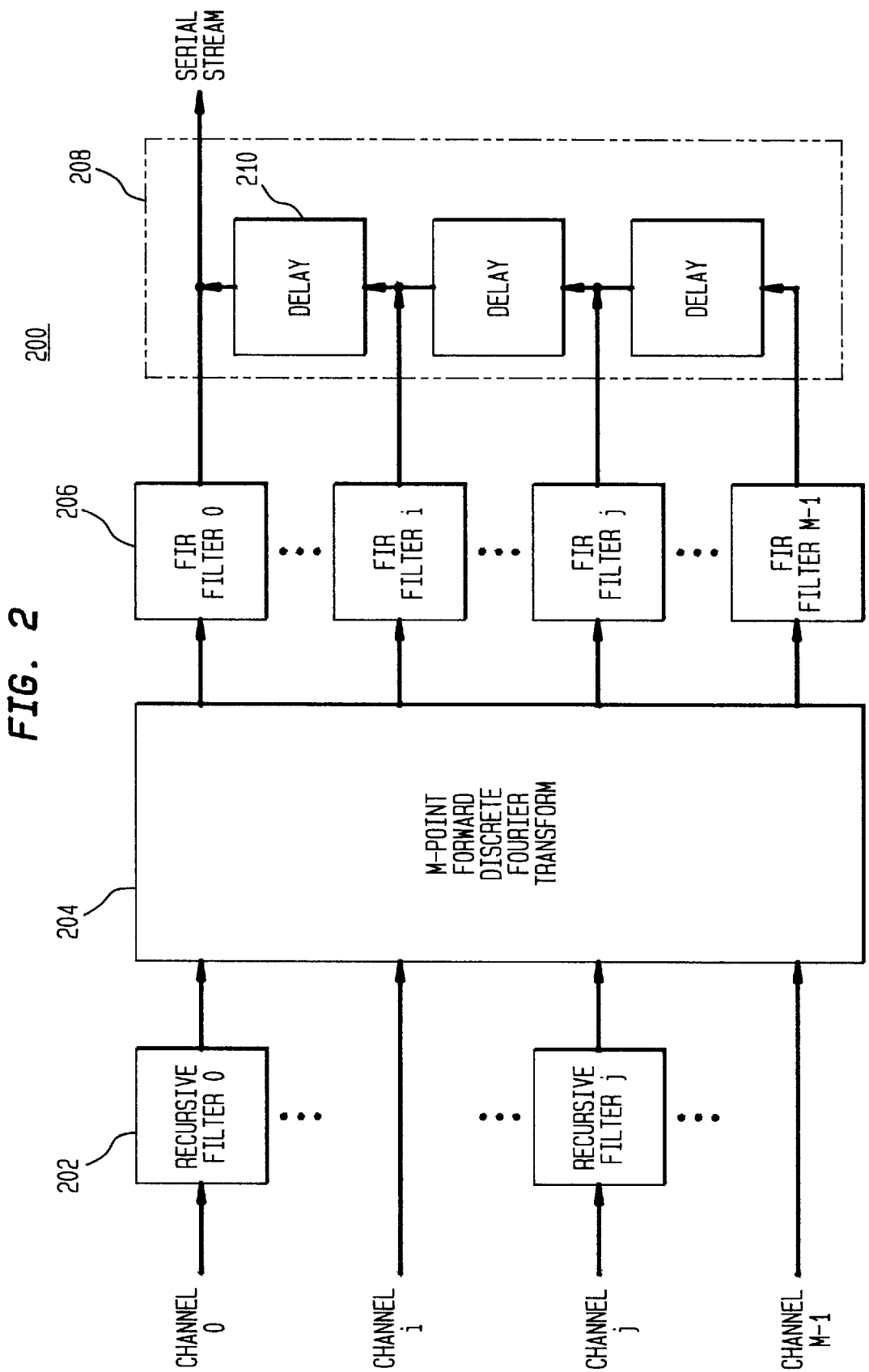
FIG. 2 is a block diagram of a polyphase transmitter, according to one embodiment of the present invention.

Referring now to FIG. 2, there is shown a block diagram of polyphase transmitter 200, according to one embodiment of the present invention. Transmitter 200 comprises one or more recursive filters 202, M-point forward discrete Fourier transform (FDFT) 204, M finite impulse response (FIR)

filters 206, and parallel-to-serial (P/S) converter 208, which comprises a cascade of delays 210. Transform 204 may be a fast Fourier transform (FFT). Each recursive filter 202 has the form $$\frac{1}{D_j(z^M)},$$

each FIR filter 206 has the form $N_i(z)$, and each delay 210 has the form $z^{-1}$. Transmitter 200 converts M signal channels into a single combined serial stream that can be further processed (e.g., modulated) for transmission to one or more remote receivers.

In particular, as shown in FIG. 2, the signals corresponding to one or more (and possibly all) of the input channels (e.g., 0 and i in FIG. 2) are recursively filtered by one of the recursive filter 202 (e.g., channels 0 and i in FIG. 2). Meanwhile, the signals corresponding to the other input channels (e.g., channels j and M−1) are not recursively filtered.

Whether they are recursively filtered or not, the signals corresponding to all M input channels are transformed by FDFT 204. Each of the resulting M transformed streams is then filtered by one of the FIR filters 206. P/S converter 208 converts the resulting M parallel FIR-filtered streams into a single serial stream that can be further processed for transmission.

Figure 3:
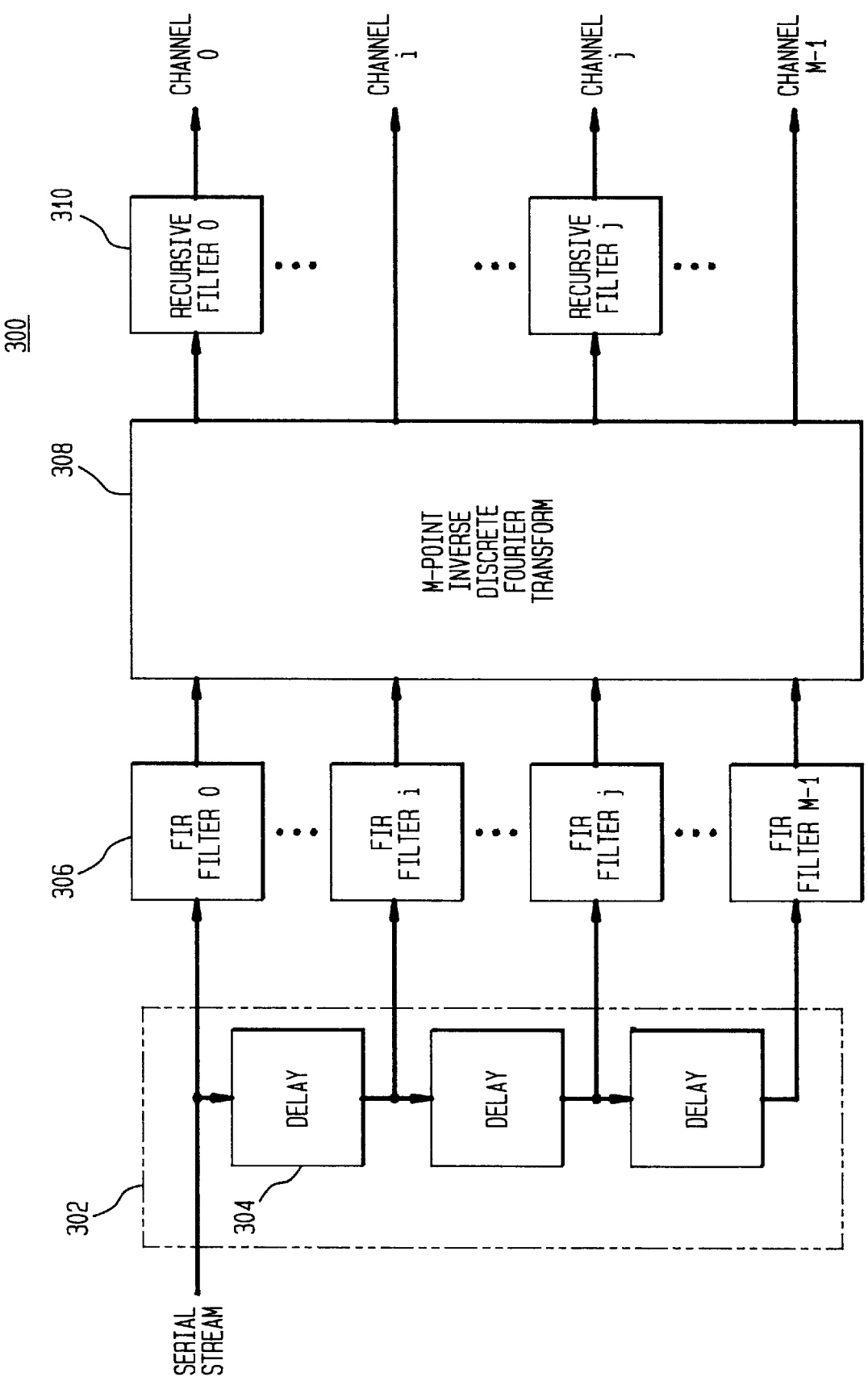
FIG. 3 is a block diagram of a polyphase receiver, according to one embodiment of the present invention.

Referring now to FIG. 3, there is shown a block diagram of polyphase receiver 300, according to one embodiment of the present invention. Receiver 300 comprises serial-to-parallel (S/P) converter 302 (which comprises a cascade of delays 304), M FIR filters 306, M-point inverse discrete Fourier transform (IDFT) 308, and one or more recursive filters 310. Transform 308 may be an FFT. Each delay 304 has the form $z^{-1}$, each FIR filter 306 has the form $N_i(z)$, and each recursive filter 310 has the form $$\frac{1}{D_j(z^M)}.$$

Receiver 300 receives a serial signal stream corresponding to the serial stream generated by transmitter 200 of FIG. 2 and processes that received serial stream to recover M channel signals corresponding to the original M channel signals processed by transmitter 200.

In particular, S/P converter 302 converts the received serial stream into M parallel streams that are then FIR filtered by one of the FIR filters 306. The resulting M FIR-filtered streams are then transformed by IDFT 308. One or more (and possibly all) of the resulting transformed streams are then recursively filtered by one of the recursive filters 310 to recover one or more of the signal channels (e.g., channels 0 and i in FIG. 3). Meanwhile, the other resulting transformed streams do not need to be recursively filtered to recover the rest of the signal channels (e.g., channels j and M−1 in FIG. 3). Note that, according to this embodiment, if a channel is recursively filtered at the transmitter, then the corresponding signals are also recursively filtered at the receiver; otherwise, the corresponding signals are not recursively filtered at the receiver.

Derivation of Filter Transfer Functions

Figure 4:
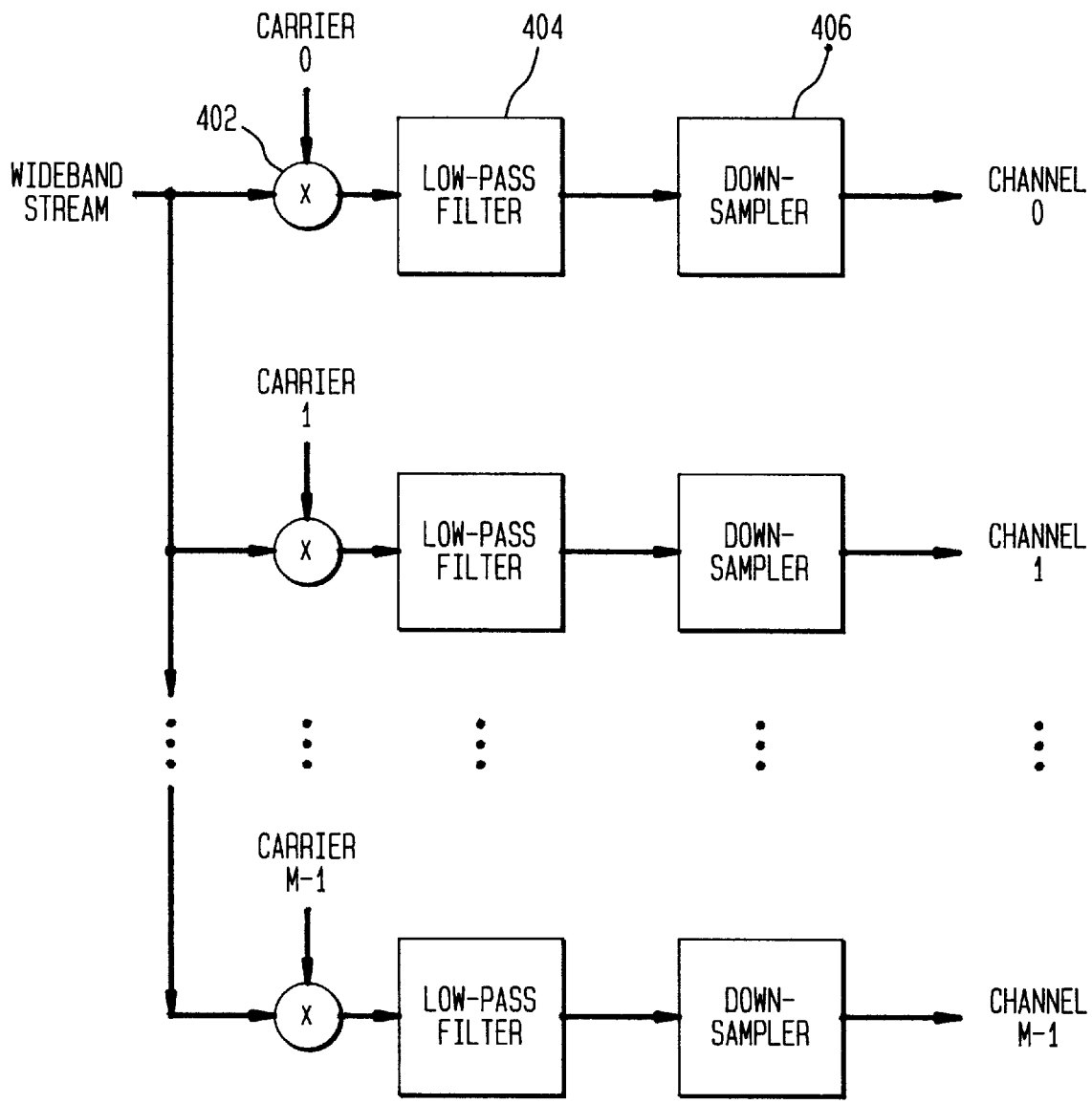
FIG. 4 is a representation of the functionality of a multi-channel digital receiver.

Referring now to FIG. 4, there is shown a representation of the functionality of a multi-channel digital receiver 400. Converters 402 isolate each of M signal channels from a wideband digital stream x(n) by digitally downconverting the particular channel to baseband. For each channel, lowpass filter 404 then removes unwanted signals, which lie outside the required channel bandwidth. Since the samples will typically have a considerable degree of redundancy, downsampler 406 downsamples the baseband signal to produce one of M narrowband channel signals $c_i(m)$. Each carrier has the form $$\exp\left(\frac{-2\pi j[i]}{M}\right),$$

each lowpass filter 404 has the form h(n), and each downsampler 406 downsamples by a factor of M, the number of channels.

It can be shown that an equivalent form of the structure of FIG. 4 is the polyphase filter. See, e.g., R. E. Crochiere and L. R. Rabiner, *Multirate Digital Signaling Processing*, Prentice-Hall, 1983, the teachings of which are incorporated here by reference.

Each phase ρ of the input signal entering the structure (distributed via a commutating process) is described by Equation (1) as follows:

$$x_\rho(m) = x(mM+\rho) \quad \rho=0,1,\ldots,M-1 \tag{1}$$

and the prototype filter for the k-th channel by Equation (2) as follows:

$$h_k(n) = h(n)W_M^{kn} = h(n)\exp\left[j2\pi k\frac{n}{M}\right] k = 0, 1, \ldots, M-1 \tag{2}$$

where h(n) is the transfer function of lowpass filter 404 and $W_M^{kn}$ is the channel down-converter function.

If the prototype filter is split into polyphase subfilters, the subfilter of the ρ-th phase for the k-th channel is given by Equation (3) as follows:

$$\bar{p}_{\rho,k}(m) = h_k(mM-\rho) \tag{3}$$

The ρ-th phase for the lowpass analysis filter h(n) is defined by Equation (4) as follows:

$$\bar{P}_\rho = h(mM-\rho) \tag{4}$$

which gives the form of the bandpass polyphase filters as Equation (5) as follows:

$$\bar{p}_{\rho,k} = \bar{P}_\rho W_M^{-kp} \text{ for } \rho,k=0,1,\ldots,M-1 \tag{5}$$

The k-th channel output is obtained from Equation (6) as follows:

$$X_k(m) = \sum_{n=-\infty}^{\infty} h_k(mM-n)x(n) \tag{6}$$

$$= \sum_{n=-\infty}^{\infty} h(mM-n)W_M^{k(mM-n)}x(n)$$

The change of variable (mM−n)→n in Equation (6) re-arranges this to Equation (7) as follows:

$$X_k(m) = \sum_{n=-\infty}^{\infty} h(n) W_M^{kn} x(mM - n) \qquad (7)$$

Making another change of variable n=(rM-p) and summing over both r and ρ leads to Equation (8) as follows:

$$X_k(m) = \sum_{\rho=0}^{M-1} \sum_{r=-\infty}^{\infty} h(rM - \rho) W_M^{k(rM-\rho)} x((m-r)M + \rho) \qquad (8)$$

Substituting the definitions of Equations (1) and (4) yields Equation (9) as follows:

$$X_k(m) = \sum_{\rho=0}^{M-1} \sum_{r=-\infty}^{\infty} \overline{p}_\rho(r) W_M^{-k\rho} x_\rho(m - r) \qquad (9)$$

$$= \sum_{\rho=0}^{M-1} W_M^{-k\rho} [\overline{p}_\rho(m) * x_\rho(m)]$$

where * denotes discrete convolution.

Letting $U_\rho = \overline{p}_\rho(m)^* x_\rho(m)$, all channels can be obtained by computing a fast Fourier transform (FFT) of the polyphase subfilters since the discrete Fourier transform (DFT) of a sequence $u_k$ is defined by Equation (10) as follows:

$$X_k = \sum_{\rho=0}^{M-1} u_\rho \exp\left[-j2\pi\frac{k\rho}{M}\right] = \sum_{\rho=0}^{M-1} u_\rho W_M^{-k\rho} \qquad (10)$$

It can be shown that an equivalent form of this structure is the polyphase filter.

Figure 5:
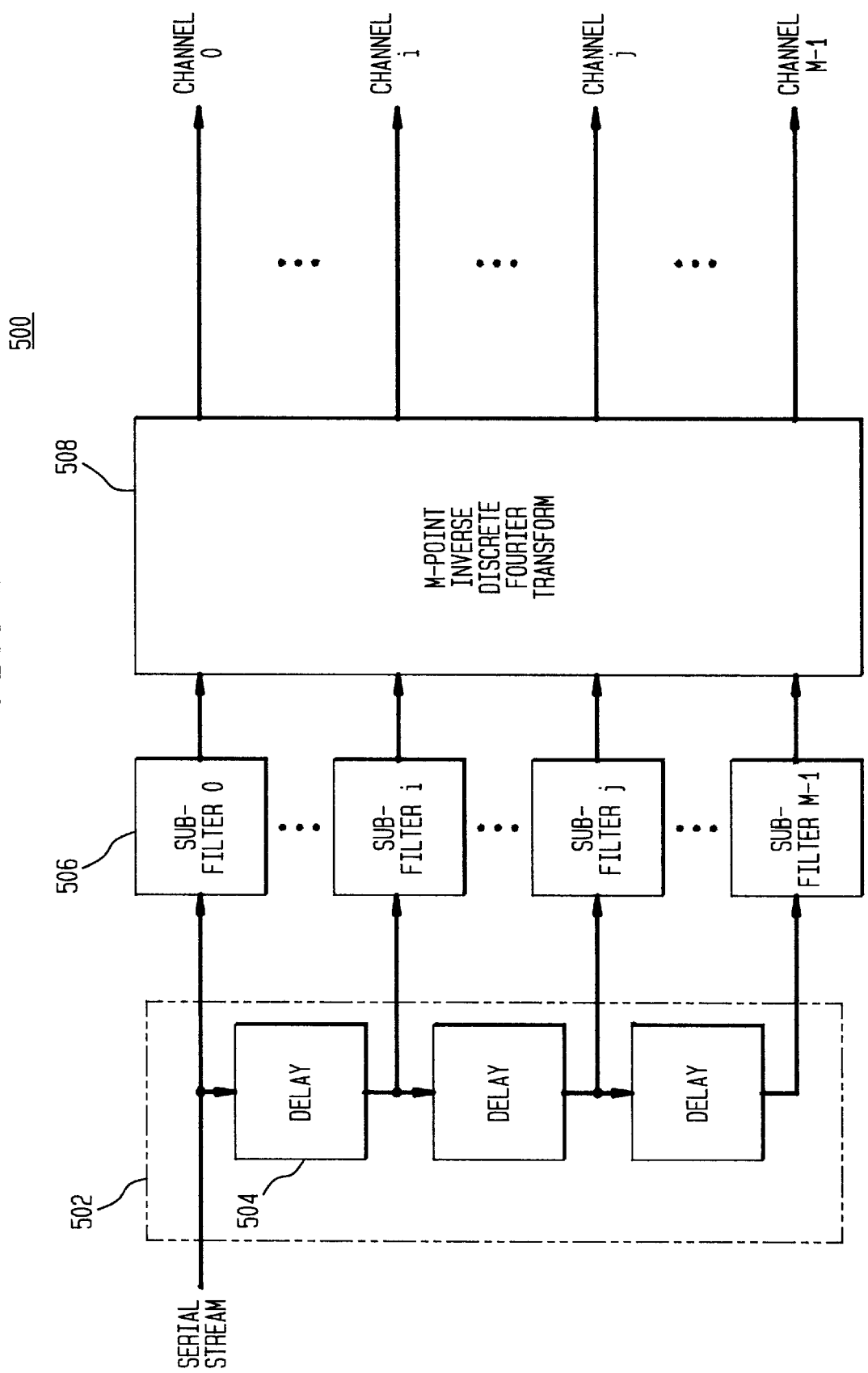
FIG. 5 is a block diagram of a conventional channelizing polyphase receiver.

Referring now to FIG. 5, there is shown a block diagram of conventional channelizing polyphase receiver 500. Receiver 500 comprises S/P converter 502 (which comprises a cascade of delays 504), M sub-filters 506, and M-point IDFT 508. Each delay 504 has the form $z^{-1}$ and each sub-filter 506 has the form $H_i(z^{-M})$. Receiver 500 processes a received serial signal stream to recover M channel signals. The prototype filter H(z) is formed from Equation (11) as follows:

$$H(z) = \sum_{i=0}^{M-1} H_i(z^M) z^{-i} \qquad (11)$$

In general, FIR structures are used to implement the prototype and resulting sub-filters, but it is clear that, in order to meet the demanding specifications of air-interface standards such as AMPS and TDMA (IS-54), an extremely high quality (Q) prototype filter is required.

Figure 6:
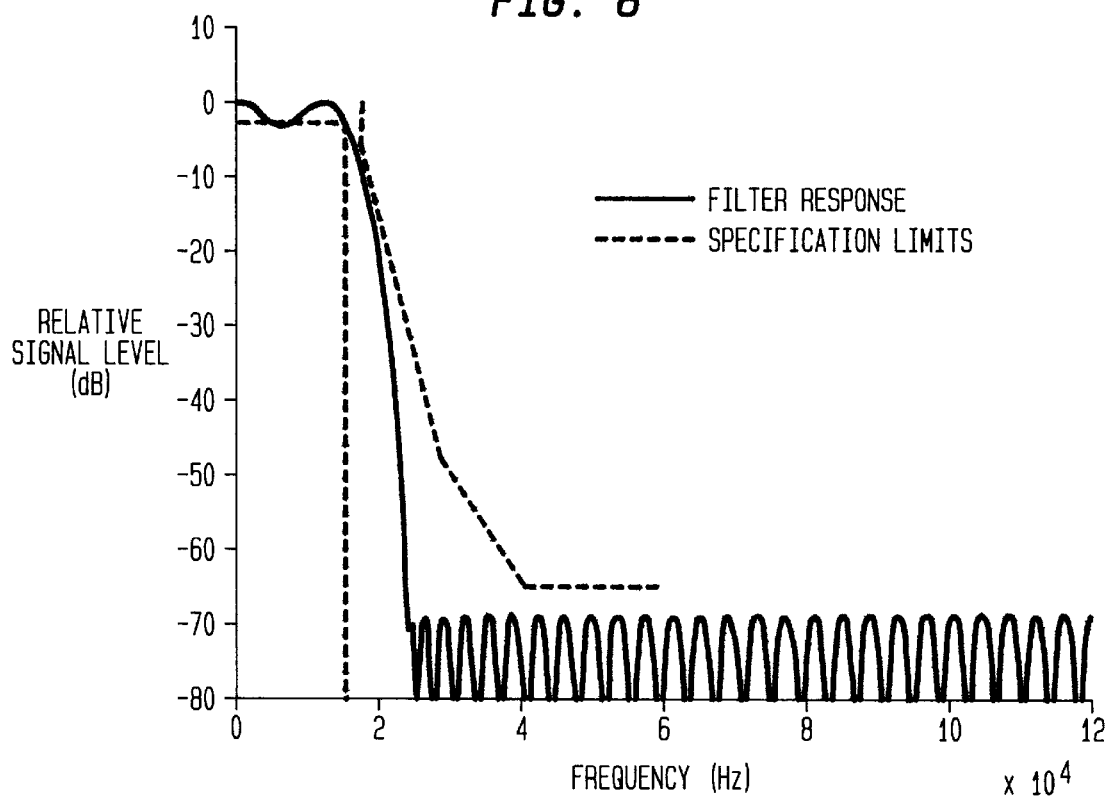
FIG. 6 is an illustration of the response and specification of an FIR filter.

As an example, suppose a system with 256 30-kHz channels were required. In this case, an equiripple design would require 1929 coefficients to meet the IS-54 specification. Such a FIR filter response and specification are illustrated in FIG. 6.

An infinite impulse response (IIR) decimation structure is described in M. G. Bellanger, J. L. Daguet, and G. P. Lepagnol, "Interpolation, extrapolation, and reduction of computation speed in digital filters," *IEEE Transactions on Acoustics, Speech and Signal Processing*, Vol. ASSP-22, pp. 231–235, August 1974 ("the Bellanger reference"), which is incorporation herein by reference. This structure may be generalized to obtain the polyphase form of receiver 300 of FIG. 3. With the FIR polyphase filter of FIG. 5, there was no restriction placed on the form of the prototype filter. Unfortunately, this is no longer the case with IIR prototype filters. In order to implement this type of filter in a polyphase structure, with maximal decimation, the denominator is a polynomial in $z^M$. This allows the denominator to be placed at the output of the polyphase channelizer and be operated at the maximally decimated rate (see, e.g., recursive filters 310 of FIG. 3).

The prototype filter has the form of Equation (12) as follows:

$$H(z) = \sum_{k=0}^{M-1} \frac{z^{-k} N_k(z^M)}{D(z^M)} \qquad (12)$$

Equation (12) can be rewritten in terms of a numerator N(z) over a denominator D(z), as shown in Equation (13) as follows:

$$H(z) = \frac{N(z)}{D(z)} = \frac{\sum_{k=0}^{M-1} z^{-k} N_k(z^M)}{D(z^M)} \qquad (13)$$

Figure 1:
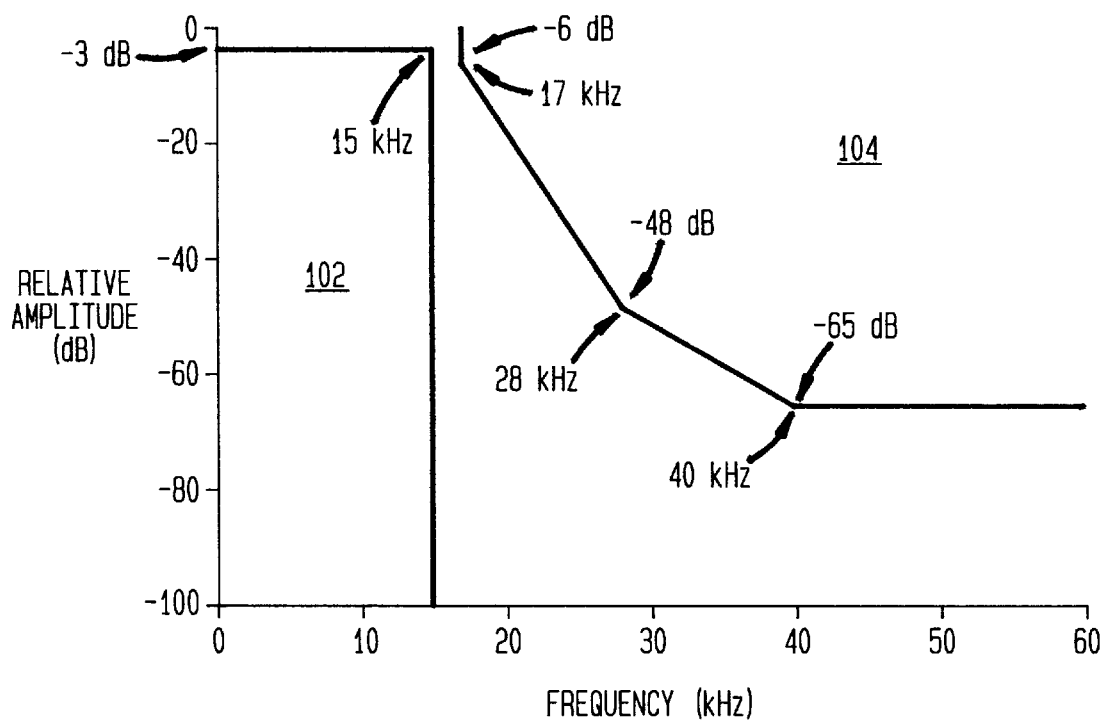
FIG. 1 is a representation of an example of particular filter specification requirements.

An extremely low-order elliptic filter may be used to meet the AMPS and TDMA (IS-54) specification of FIG. 1. Elliptic filters can be realized in a direct form infinite impulse cascade of S second-order sections, as described by Equation (14) as follows:

$$H(z) = \prod_{s=0}^{S-1} \left[ \frac{1 + b[s,1]z^{-1} + z^{-2}}{1 + a[s,1]z^{-1} + a[s,2]z^{-2}} \right] \qquad (14)$$

Figure 7A:
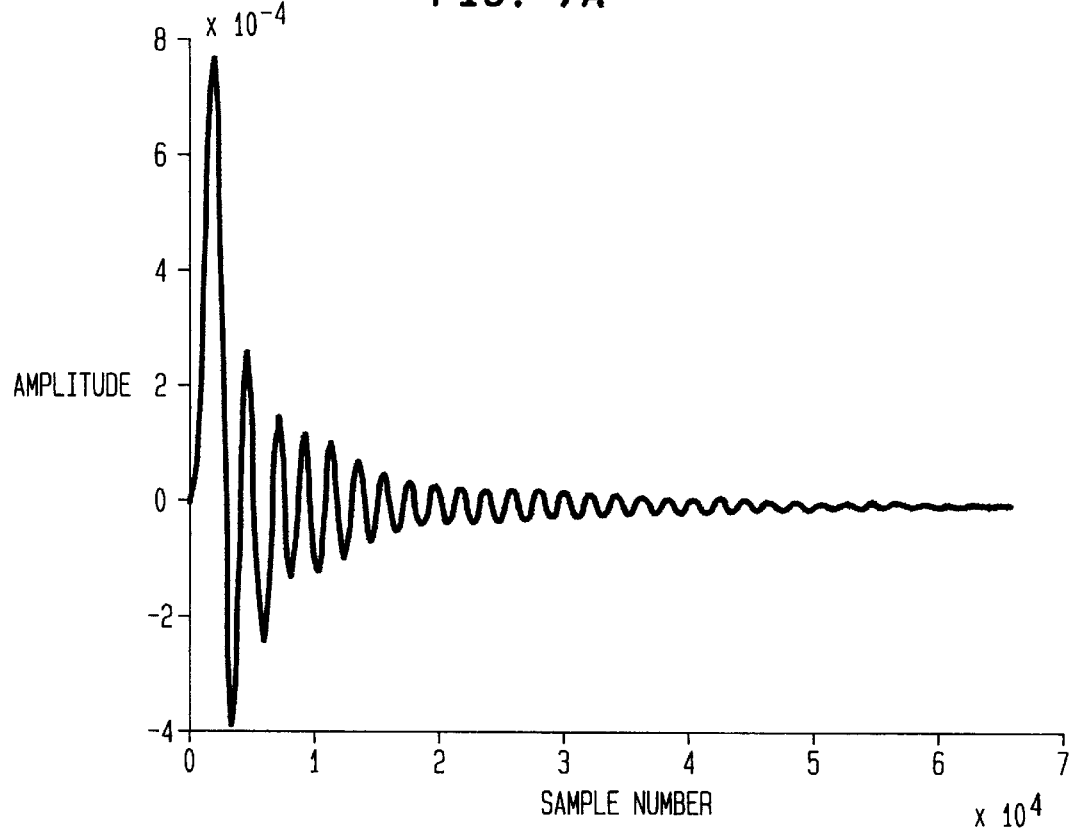
FIGS. 7(a) and (b) are graphical representations of the impulse response and the frequency response for an 8th-order elliptic prototype filter.
Figure 7B:
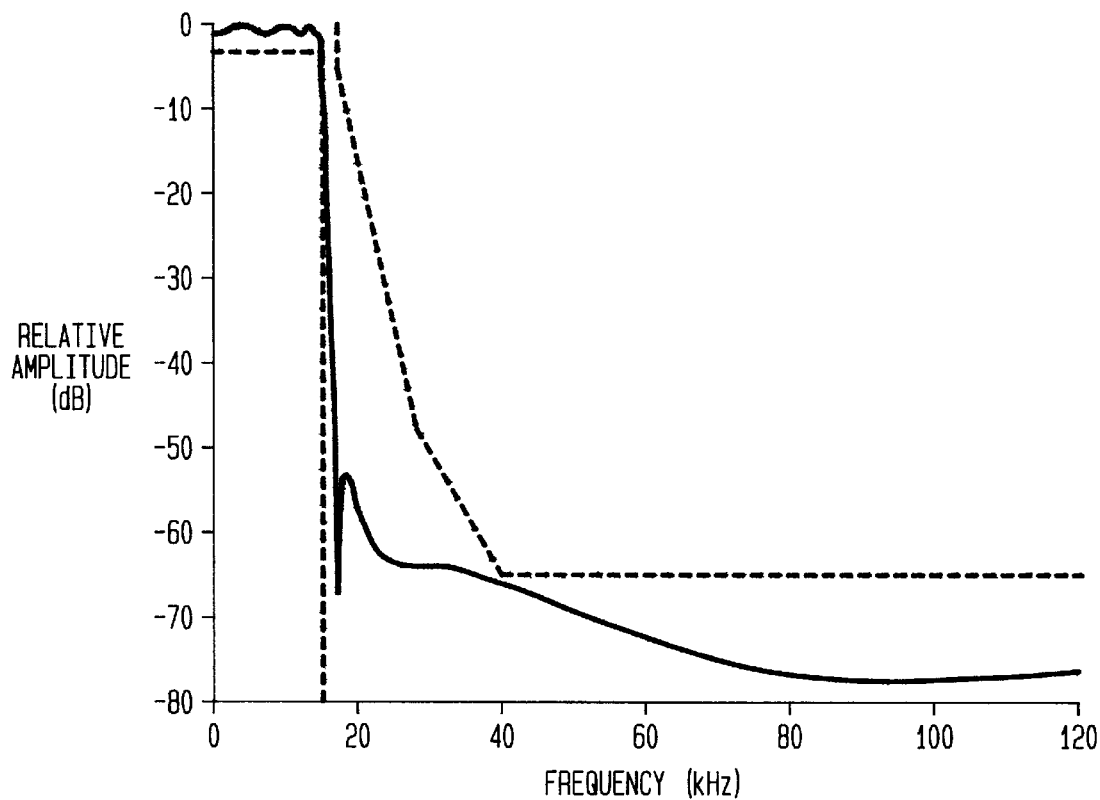

Referring now to FIGS. 7(a) and (b), there are shown graphical representations of the impulse response and the frequency response for an 8th-order elliptic prototype filter, using the coefficients given in Table I. Due to the high Q of this filter, its poles and zeros lie very close to z=1. As a result, such a structure is very sensitive to rounding errors in implementation and double-precision floating-point arithmetic should be used to implement this filter.

TABLE I

Coefficients for 8th-Order Elliptic Filter

| Section | b[s,1] | a[s,1] | a[s,2] |
| --- | --- | --- | --- |
| 0 | −1.9997893273588231988 | −1.9986189304509249798 | 0.99862006832468652728 |
| 1 | −1.9999693832408007577 | −1.9991017162108251082 | 0.99910633603931675584 |
| 2 | −1.9999831564812771134 | −1.9995756543488480972 | 0.99958351265916256523 |
| 3 | −1.9999861614273464205 | −1.9998762557622113967 | 0.99988564620734843302 |

To transform the protype filter of Equation (14) into the form for polyphase decomposition, each pole in the prototype filter in substituted according to Equation (15) as follows:

$$\frac{1}{z - p_i} = \frac{z^{M-1} + p_i z^{M-2} + \ldots + p_i^{M-1}}{z^M - p_i^M} \quad (15)$$

This results in a numerator which now has $(2S-1)M+1$ terms and a denominator which is a polynomial in $z^M$ and has $2S$ terms. When the prototype filter is transformed in this way, the resulting filter is less sensitive to numerical inaccuracies.

Those skilled in the art will understand that the transformation from the prototype IIR filter into the form for polyphase decomposition may yield a filter that is no longer optimum. This issue is examined in H. G. Martinez and T. W. Parks, "A Class of Infinite-Duration Impulse Response Digital Filters for Sampling Rate Reduction," *IEEE Transactions on Acoustics, Speech and Signal Processing*, Vol. ASSP-27, pp. 154–162, April 1979 ("the Martinez reference"), which is incorporated herein by reference. The Martinez reference derives a class of IIR filters that have denominators that are polynomials in $z^M$. These filters have a considerable computational advantage over the form derived by the Bellanger reference.

In order to compare the computational advantage of such filters over the direct transformation of elliptic designs, the order requirements are compared. For a prototype elliptic filter, the order $n_{ell}$ is obtained from Equation (16) as follows:

$$n_{ell} = \frac{K(k)K\left(\sqrt{1 - K_1^2}\right)}{K(k_1)K\left(\sqrt{1 - k^2}\right)} \quad (16)$$

where $K(\cdot)$ is the complete elliptic integral of the first kind defined by Equations (17)–(19) as follows:

$$K(x) = \int_0^{\pi/2} \frac{d\theta}{\sqrt{1 - x^2 \sin^2 \theta}} \quad (17)$$

and $$k = \text{transition ratio} = \frac{1}{\Omega_s} = \frac{\tan(\omega_p)}{\tan(\omega_s)} \quad (18)$$

and $$k_1 = \eta = \frac{\epsilon}{\sqrt{A^2 - 1}} = \frac{2\delta_2 \sqrt{\delta_1}}{(1 - \delta_1)\sqrt{(1 + \delta_1)^2 - \delta_2^2}} \quad (19)$$

See, e.g., L. R. Rabiner, J. F. Kaiser, O. Herrmann, and M. T. Dolan, "Some Comparisons Between FIR and IIR Digital Designs," *Bell System Technical Journal*, Vol. 53, pp. 305–331, February 1974, the teachings of which are incorporated herein by reference.

For receiver 300 of FIG. 3, using k=0.8333 and $k_1$=5.6234×10$^{-4}$ yields $n_{ell}$=7.22. Thus, the lowest-order filter that will satisfy the specification is n=8, as used earlier. In its maximally decimated form, this results in a polyphase filter that requires 1791 coefficients. This is not a significant gain over the FIR approach of FIG. 5 (which required 1929 coefficients) and may have the disadvantage of requiring much greater computational accuracy.

Allpass filters provide a computationally efficient means for realizing high-order IIR filter structures. See, e.g., F. J. Harris, "On the Design and Performance of Efficient and Novel Filter Structures using Recursive Allpass Filters," *International Symposium on Signal Processing and its Applications*, (Gold Coast, Australia), pp. 1–6, August 1992 ("the Harris reference"), the teachings of which are incorporated herein by reference. The basic transfer function of an allpass filter, with K stages, is given by Equation (20) as follows:

$$A(z^M) = \prod_{k=0}^{K-1} \frac{1 + \alpha_k z^M}{z^M + \alpha_k} \quad (20)$$

By creating two or more such structures and combining their outputs, filtering is achieved by arranged their phase characteristics to be constructive in the passband and destructive in the stopband.

Figure 8A:
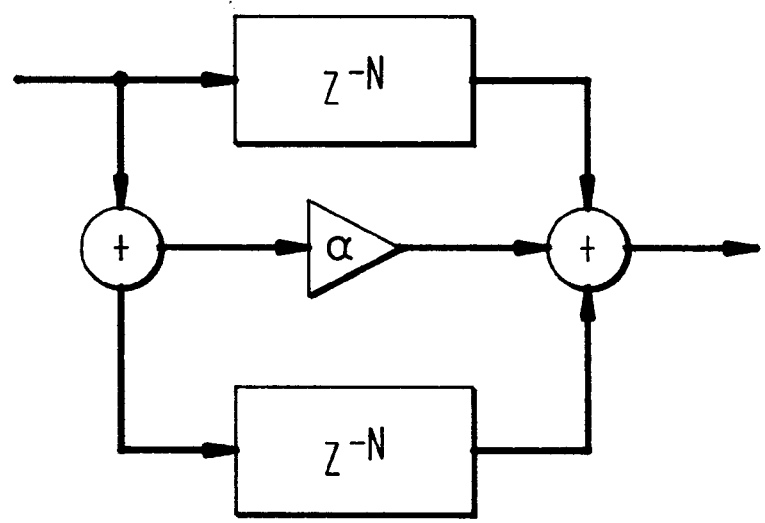
FIGS. 8(a) and (b) are representations of how an allpass structure can be implemented using a single multiply operation per input sample.
Figure 8B:
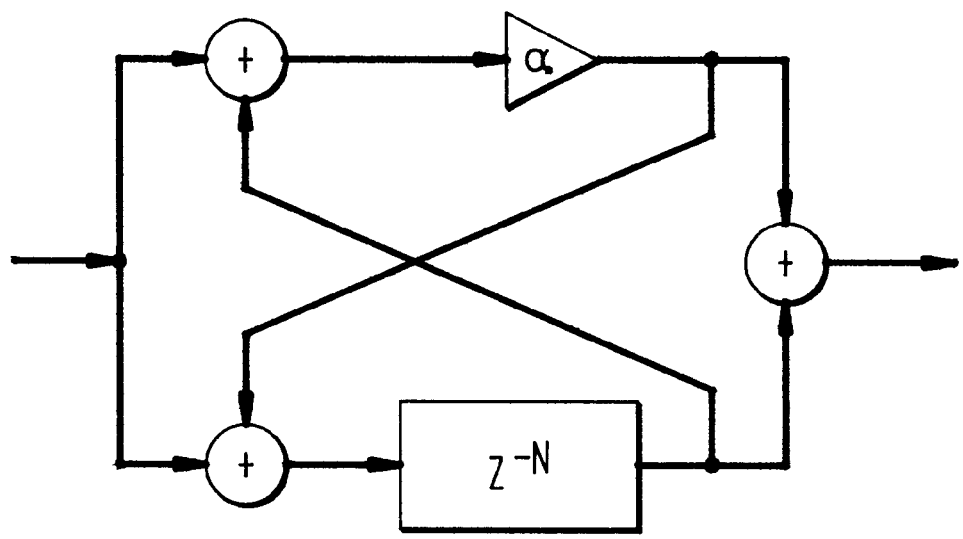

Referring now to FIGS. 8(*a*) and (*b*), there are shown representations of how an allpass structure can be implemented using a single multiply operation per input sample. The structure shown in FIG. 8(*a*) has two additions and two memory elements, while the structure shown in FIG. 8(*b*) has three additions and a single memory element.

The technical literature describes the case for M=2, showing how two allpass stages are combined using the inverse FFT (IFFT) ro produce highpass and lowpass transfer functions. See, e.g., the Harris reference and P. P. Vaidyanathan, P. A. Regalia, and S. K. Mitra, "Design of Doubly-Complementary IIR Digital Filters Using a Single Complex Allpass Filter With Multirate Applications," *IEEE Transactions on Circuits and Systems*, Vol. CAS-34, pp.378–389, April 1987, the teachings of which are incorporated herein by reference.

Figure 9:
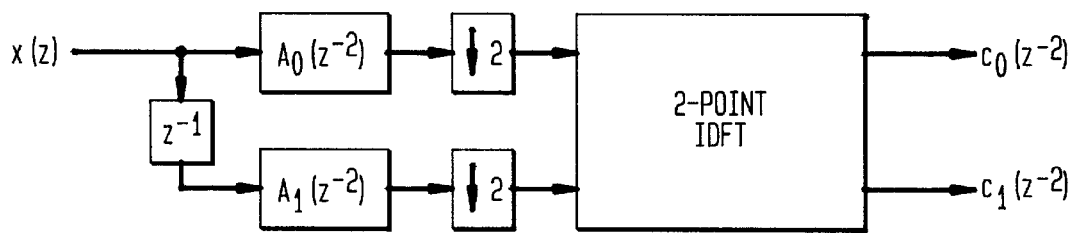
FIG. 9 is a representation of two-channel allpass polyphase receiver.

Referring now to FIG. 9, there is shown a representation of two-channel allpass polyphase receiver. The transfer functions for such a system are given by Equations (21) and (22) as follows:

$$c_0(z) = \frac{1}{2}\left[\frac{1 + \alpha_0 z^2}{z^2 + \alpha_0} + (z^{-1})\frac{1 + \alpha_1 z^2}{z^2 + \alpha_1}\right] \quad (21)$$

$$c_1(z) = \frac{1}{2}\left[\frac{1 + \alpha_0 z^2}{z^2 + \alpha_0} - (z^{-1})\frac{1 + \alpha_1 z^2}{z^2 + \alpha_1}\right] \quad (22)$$

Techniques exist for designing such allpass filters with equiripple responses. See, e.g., C. Chen and J. H. Lee, "Design of Digital Allpass Filters using a Weighted Least Squares Approach," IEEE Tr. CAS II, Vol. 41, pp.346–350, May 1994 and M. Lang and T.I. Laakso, "Simple and Robust Method for the Design of Allpass Filters using Least Squares Phase Error Criterion," *IEEE Tr. CAS II*, pp. 40–48, 1994, the teaching of which are incorporated herein by reference.

Figure 10:
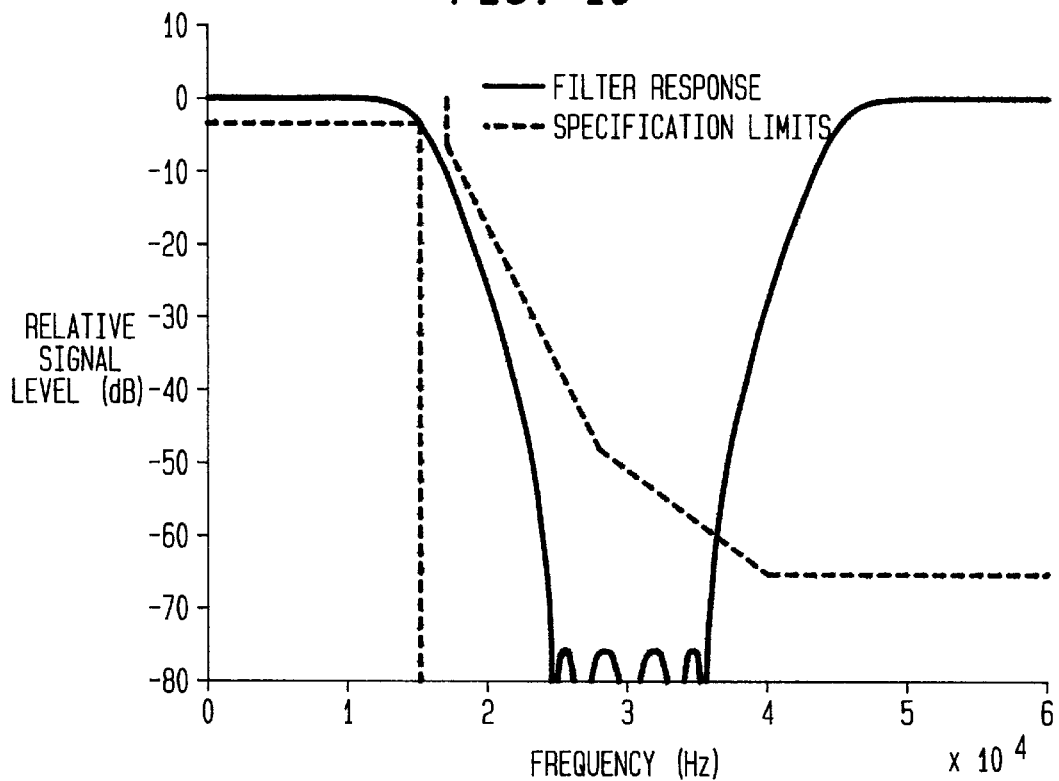
FIG. 10 is a graphical representation of an example equiripple filter design.

Referring now to FIG. 10, there is shown a graphical representation of an example equiripple filter design. This filter meets and, in fact, exceeds the specification required for a two-channel system with a single pair of allpass filters.

Equation (22) can be expanded as a ratio of two polynomials to yield Equation (23) as follows:

$$c_0(z) = \qquad (23)$$

$$\frac{\alpha_0 + \alpha_1 z^{-1} + (\alpha_0\alpha_1 + 1)z^{-2} + (\alpha_0\alpha_1 + 1)z^{-3} + \alpha_1 z^{-4} + \alpha_0 z^{-5}}{1 + (\alpha_0 + \alpha_1)z^{-2} + \alpha_0\alpha_1 z^{-4}}$$

This filter can be viewed as having two filters: one that is purely non-recursive (e.g., FIR) and one that is purely recursive (e.g., IIR). If we substitute $z \rightarrow z^{M/2}$ where M is the number of polyphase channels in the system, then a filter is obtained that has the correct transition bandwidth and attenuation for the specification, but has alias filters throughout the band.

Inspection of Equation (23) shows that this filter already has the correct form for the IIR polyphase transformation of receiver 300 of FIG. 3. This indicates the appropriate way to proceed with the design of an M-channel filter.

Generalizing Equation (23) for an M-channel system yields Equation (24) as follows:

$$c_0(z) = \frac{N(z)}{D(z^M)} = \frac{\sum_{p=0}^{P-1} h_p z^{-p}}{1 + (\alpha_0 + \alpha_1)z^{-M} + \alpha_0\alpha_1 z^{-2M}} \qquad (24)$$

where P is the total number of coefficients required to implement the non-recursive part of the polyphase receiver. This may be realized with a single recursive quadratic filter at the decimated rate for each channel. The channel selectivity is obtained from the non-recursive part of the filter, N(z) (e.g., FIR filters 306 of FIG. 3).

For a given target specification the filter coefficients of N(z) can be computed using a modified Remez exchange algorithm. See, e.g., J. H. McClellan, T. W. Parks, and L. R. Rabiner, "A Computer Program for Designing Optimum FIR Linear Phase Digital Filters," *IEEE Trans. on Audio and Electroacoustics*, Vol. AU-21, pp. 506–526, December 1973. Modifications to the Remez exchange algorithm adjust the desired passband response according to $D(z^M)$ and weight proportionally the error in the stopband according to the reciprocal of $D(z^M)$.

Figure 11:
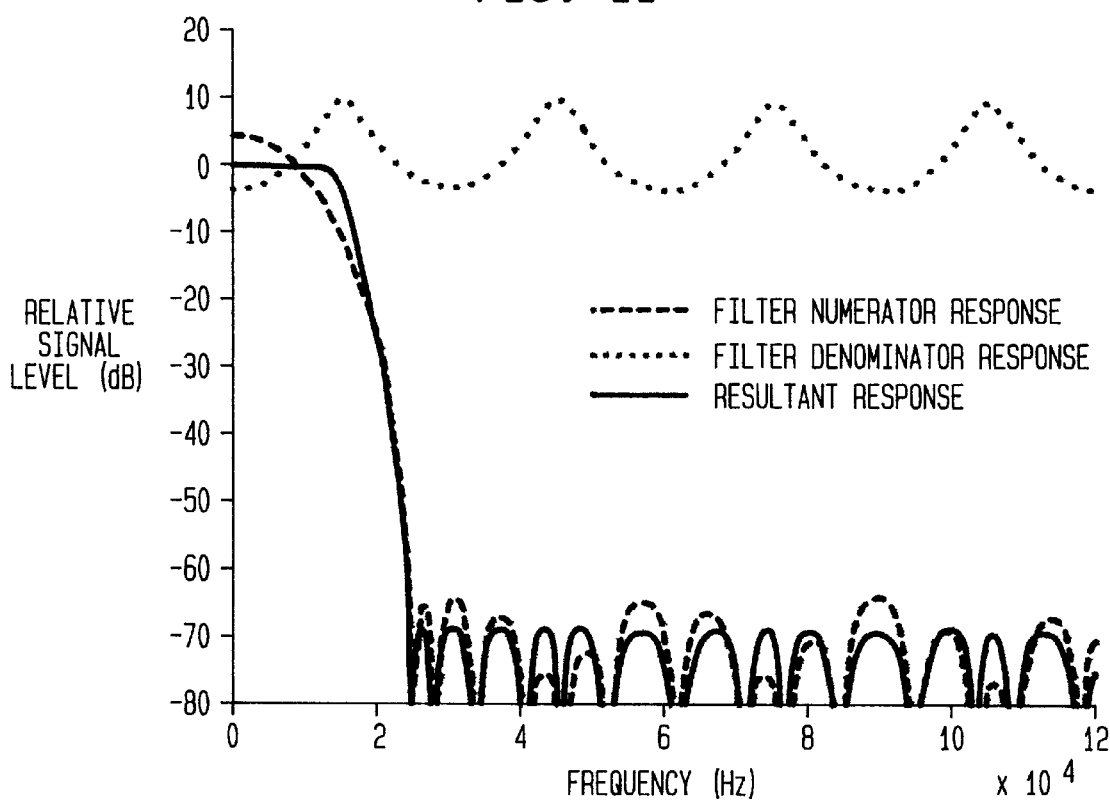
FIG. 11 is a graphical representation of the performance of a 256-channel filter generated using the present invention.

Referring now to FIG. 11, there is shown a graphical representation of the performance of a 256-channel filter generated using this approach. FIG. 11 shows the recursive (i.e., denominator) response as a dotted line, the non-recursive (i.e., numerator) response as a dashed line, and the resultant response as a solid line.

Figure 12:
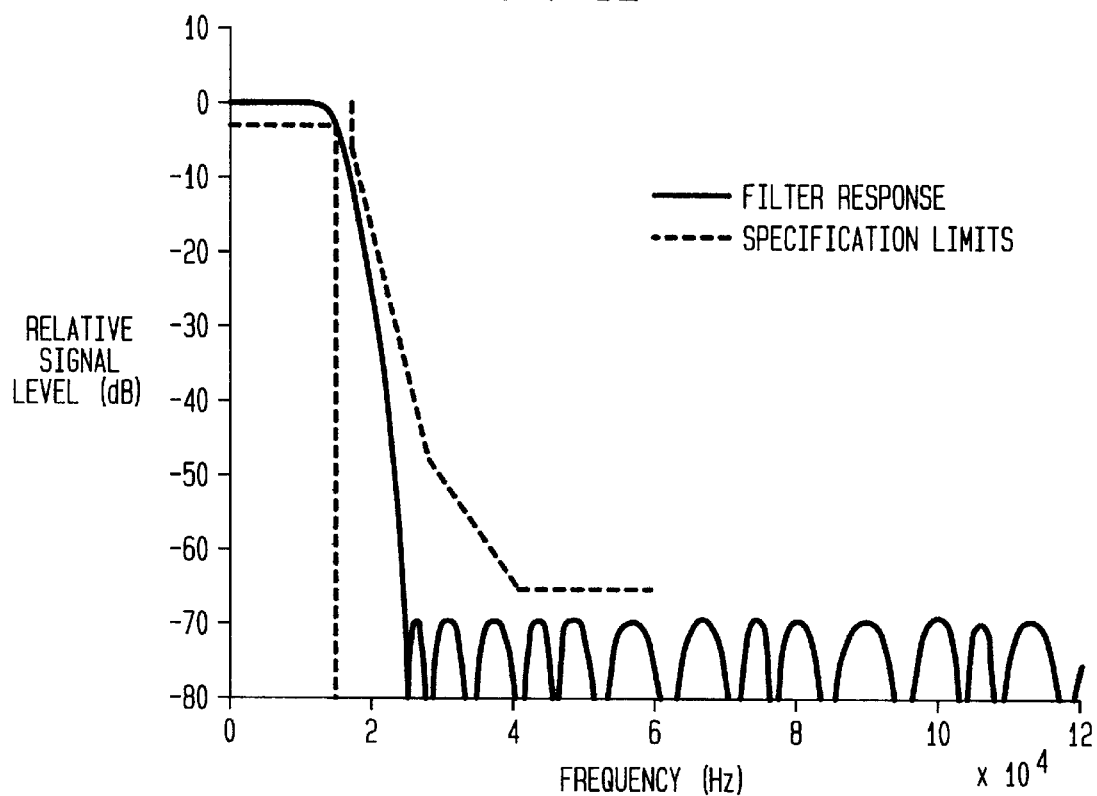
FIG. 12 is a graphical representation of the performance of the 256-channel filter of FIG. 11 as compared to the IS-54 specification requirements.
Figure 13:
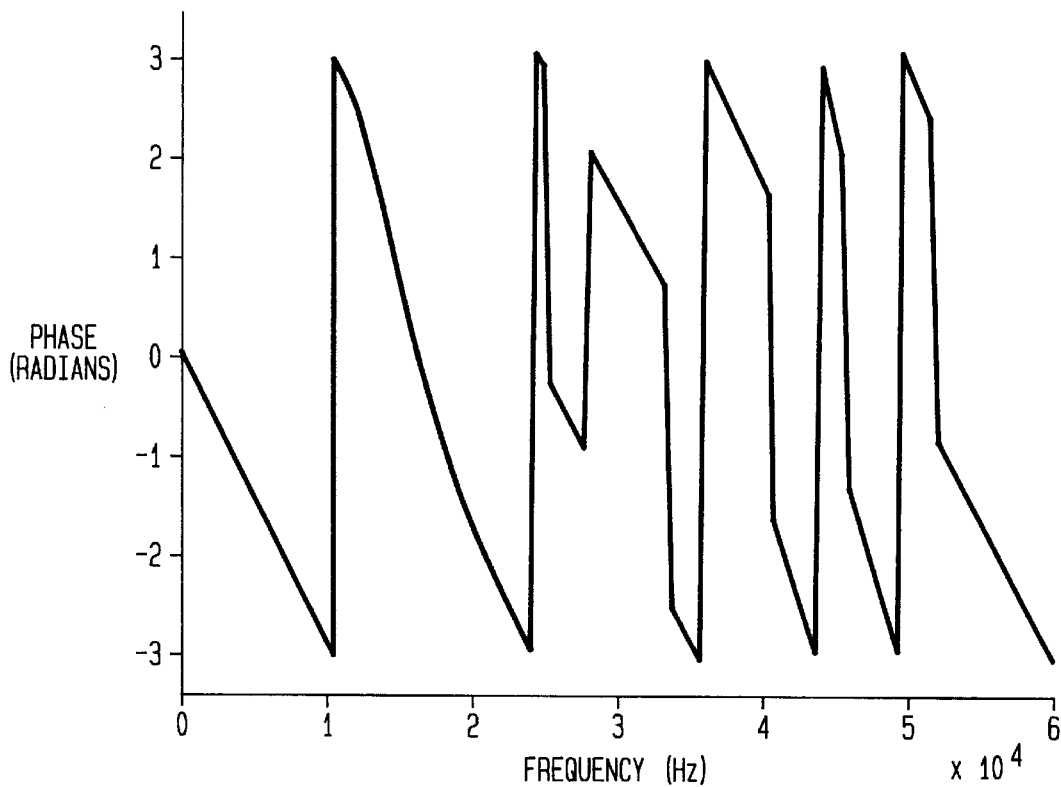
FIG. 13 is a graphical representation of the phase characteristics of the filter of FIG. 12.

Referring now to FIG. 12, there is shown a graphical representation of the performance of the 256-channel filter of FIG. 11 (shown in solid line) as compared to the IS-54 specification requirements (shown in dashed line). The number of coefficients required to meet the IS-54 specification is 3.5M (for M even and greater than 2). Thus, for 256 channels, a total of 896 coefficients are required, as compared with the pure FIR case which requires 1929 coefficients. This provides a significant saving in computation and also in performance, since the recursive filter of the present invention has much better passband and stopband performance as compared to the performance of the FIR filter shown in FIG. 6. As shown in FIG. 13, the phase characteristics of the filter of FIG. 12 are also fairly linear, primarily because the dominant portion of this filter is a linear phase filter.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for designing a polyphase receiver, comprising the steps of:
   (1) selecting an infinite impulse response (IIR) prototype filter based on an all-pass filter; and
   (2) formulating the IIR filter as a polyphase structure by applying a modified version of a Remez exchange algorithm to generate coefficients for the polyphase receiver, wherein the Remez exchange algorithm has been modified to adjust a desired passband response according to $D(z^M)$ and to weight proportionally error in a stopband according to a reciprocal of $D(z^M)$, wherein the polyphase receiver is adapted to:
      (a) receive a serial stream of signals corresponding to M signal channels, where M is an integer greater than 1;
      (b) convert the serial stream into M parallel streams; and
      (c) apply a filter to the M parallel streams to recover the M signal channels, wherein the filter implements a function comprising a non-recursive numerator N(z) and a recursive denominator $D(z^M)$ that is a polynomial in $z^M$, where z is a variable in a Fourier frequency domain.

2. The invention of claim 1, wherein step (c) comprises the steps of:
   (1) applying a finite impulse response (FIR) filter to each parallel stream;
   (2) applying a Fourier transform to the M FIR-filtered streams to generate M transformed streams; and
   (3) applying a recursive filter to at least one of the M transformed streams.

3. The invention of claim 2, wherein the Fourier transform is a fast Fourier transform (FFT) or a discrete Fourier transform (DFT).

4. The invention of claim 3, wherein the recursive denominator is a polynomial in $z^M$ of order of at least two.

5. The invention of claim 1, wherein the recursive denominator is a polynomial in $z^M$ of order of at least two.

6. The invention of claim 1, wherein the IIR filter $c_0(z)$ has the following generalized form:

$$c_0(z) = \frac{N(z)}{D(z^M)} = \frac{\sum_{p=0}^{P-1} h_p z^{-p}}{1 + (\alpha_0 + \alpha_1)z^{-M} + \alpha_0\alpha_1 z^{-2M}}$$

where P is a total number of coefficients used to implement the numerator N(z), and $h_p$, $\alpha_0$, and $\alpha_1$ are specified constants.

7. A method for designing a polyphase transmitter for, comprising the steps of:
   (1) selecting an infinite impulse response (IIR) prototvpe filter based on an all-pass filter; and
   (2) formulating the IIR filter as a polyphase structure by applying a modified version of a Remez exchange algorithm to generate coefficients for the polyphase receiver wherein the Remez exchange algorithm has been modified to adjust a desired passband response according to $D(z^M)$ and to weight proportionally error in a stopband according to a reciprocal of $D(z^M)$, wherein the polyphase transmitter is adapted to:
      (a) receive M parallel streams corresponding to M signal channels, where M is an integer greater than 1;

(b) apply a filter to the M parallel streams to generate M parallel filtered streams, wherein the filter implements a function comprising a non-recursive numerator and a recursive denominator that is a polynomial in $z^M$, where z is a variable in a Fourier frequency domain; and (c) convert the M parallel filtered streams into a serial stream of signals corresponding to the M signal channels for transmission.

8. The invention of claim 7, wherein step (b) comprises the steps of:

(1) applying a recursive filter to L of the M parallel streams, wherein L is between one and M inclusive;

(2) applying a Fourier transform to the L recursively filtered streams and the (M-L) other parallel streams to generate M transformed streams; and (3) applying a FIR filter to each of the M transformed streams.

9. The invention of claim 7, wherein the Fourier transform is an FFT or a DFT.

10. The invention of claim 9, wherein the recursive denominator is a polynomial in $Z^M$ of order of at least two.

11. The invention of claim 7, wherein the recursive denominator is a polynomial in $z^M$ of order of at least two.

12. The invention of claim 6, wherein the IIR filter $c_0(z)$ has the following generalized form:

$$c_0(z) = \frac{N(z)}{D(z^M)} = \frac{\sum_{p=0}^{P-1} h_p z^{-p}}{1 + (\alpha_0 + \alpha_1)z^{-M} + \alpha_0\alpha_1 z^{-2M}}$$

where P is a total number of coefficients used to implement the numerator N(z), and $h_p$, $\alpha_0$, and $\alpha_1$ are specified constants.

* * * * *